United States Patent [19]

Nilsson et al.

[11] Patent Number: 5,506,511

[45] Date of Patent: Apr. 9, 1996

[54] METHOD OF ELECTRICALLY DETECTING ON-SITE PARTIAL DISCHARGES IN THE INSULATING MEDIUM OF AN ELECTRICAL POWER TRANSFORMER AND APPARATUS THEREFOR

[75] Inventors: Stig L. Nilsson, Los Gatos, Calif.; William B. Gish, Lemont, Pa.

[73] Assignee: Electric Power Research Institute Inc., Palo Alto, Calif.

[21] Appl. No.: 303,341

[22] Filed: Sep. 9, 1994

[51] Int. Cl.⁶ .................................................. G01R 31/12
[52] U.S. Cl. .......................... 324/553; 324/536; 324/547; 324/551
[58] Field of Search .................... 324/76.12, 76.29, 324/76.39, 76.44, 102, 536, 546, 547, 551, 553

[56] References Cited

U.S. PATENT DOCUMENTS

| | | | |
|---|---|---|---|
| 3,727,129 | 4/1973 | Hummert | 324/547 |
| 4,245,187 | 1/1981 | Wagner et al. | 324/547 |
| 4,710,705 | 12/1987 | Kawabata | 324/102 |
| 5,233,305 | 8/1993 | Nishizawa et al. | 324/547 |
| 5,386,193 | 1/1995 | Maeda et al. | 324/547 |

*Primary Examiner*—Kenneth A. Wieder
*Assistant Examiner*—Glenn W. Brown
*Attorney, Agent, or Firm*—Flehr, Hohbach, Test, Albritton & Herbert

[57] ABSTRACT

A method for determining transient partial discharges in the insulating medium of an electrical power transformer, for example, oil and paper, uses in one embodiment a circular plate inserted in the interior of a transformer tank which picks up partial discharge signals. These are high frequency transients which are processed by use of DC notch filters, blocking capacitors and amplified by high frequency amplifiers. The peaks of the partial discharge signal are detected by peak amplifiers, sorted by relative magnitudes, and either displayed or further processed by computer techniques for indicating incipient transformer failure.

7 Claims, 5 Drawing Sheets

METHOD OF ELECTRICALLY DETECTING ON-SITE PARTIAL DISCHARGES IN THE INSULATING MEDIUM OF AN ELECTRICAL POWER TRANSFORMER AND APPARATUS THEREFOR

The present invention is directed to a method of electrically detecting on-site transient partial discharges in the insulating medium of an electrical power transformer and apparatus therefor.

BACKGROUND OF THE INVENTION

Partial discharges (PD) are often a precursor to failures of electrical insulation such as the oil impregnated paper dielectric used in power transformers. The PD is a result of an electrical stress which locally exceeds the withstand level of the dielectric (or insulation) resulting in an electrical avalanche; that is, a discharge. The discharge is local since it does not bridge the entire dielectric system causing an undesirable power arc but merely discharges a small volume of the dielectric system. Hence the designation "partial". If, however, the discharge is continuing, eventually it would be destructive to at least the dielectric system affected by the discharge or it could spread into a full destruction of the dielectric system of the transformer.

The general concept of the foregoing partial discharge phenomenon in large power transformers has been known but there has been no practical on-site electrical monitoring technique developed. In other words, at present electrical PD detection is limited to laboratory facilities used for high voltage testing of power transformers. In addition there has been the use of measurements made of the ultra-sounds generated by a discharge.

OBJECT AND SUMMARY OF INVENTION

It is therefore an object of the present invention to provide an electrical on-site method of detecting transient partial discharges in the insulating medium of an electrical power transformer and apparatus therefor.

In accordance with the above a method of detecting partial discharges in an insulating medium of an electrical power transformer or similar electrical equipment comprises the steps of sensing electrical signals generated by the transient partial discharges in the insulating medium. The signals are filtered to reject both direct current and 60 hertz frequencies. The amplitude peaks for each of the signals is detected to provide an indication of their relative magnitudes and also their frequency of occurrence. An equivalent apparatus accomplishing the foregoing is also provided including plate means within the transformer for picking up signals.

DETAILED DESCRIPTION OF PREFERRED EMBODIMENTS

Figure 1:
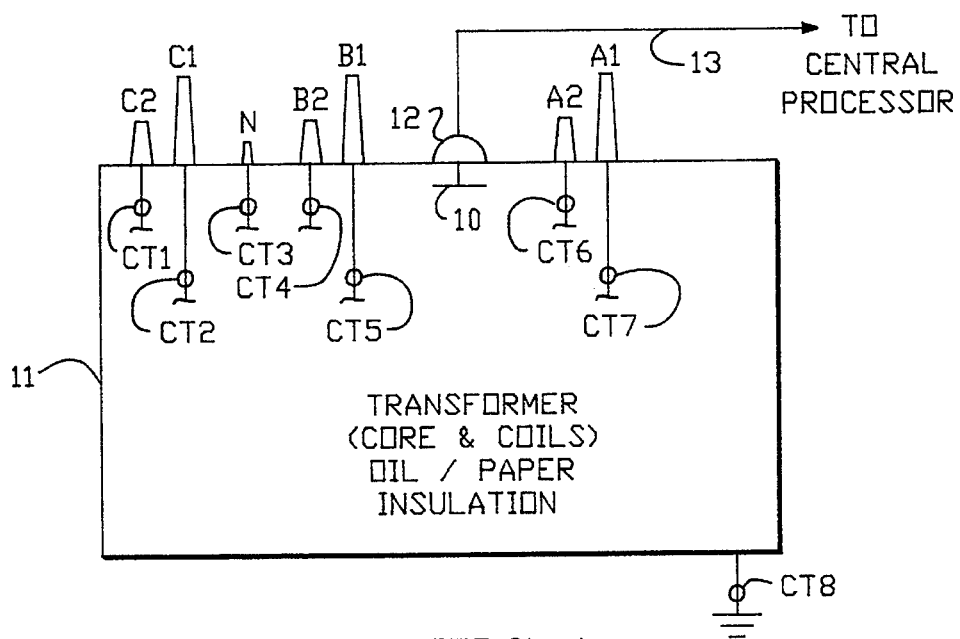
FIG. 1 is a simplified elevational view of a transformer incorporating apparatus used in the present invention.
Figure 4:
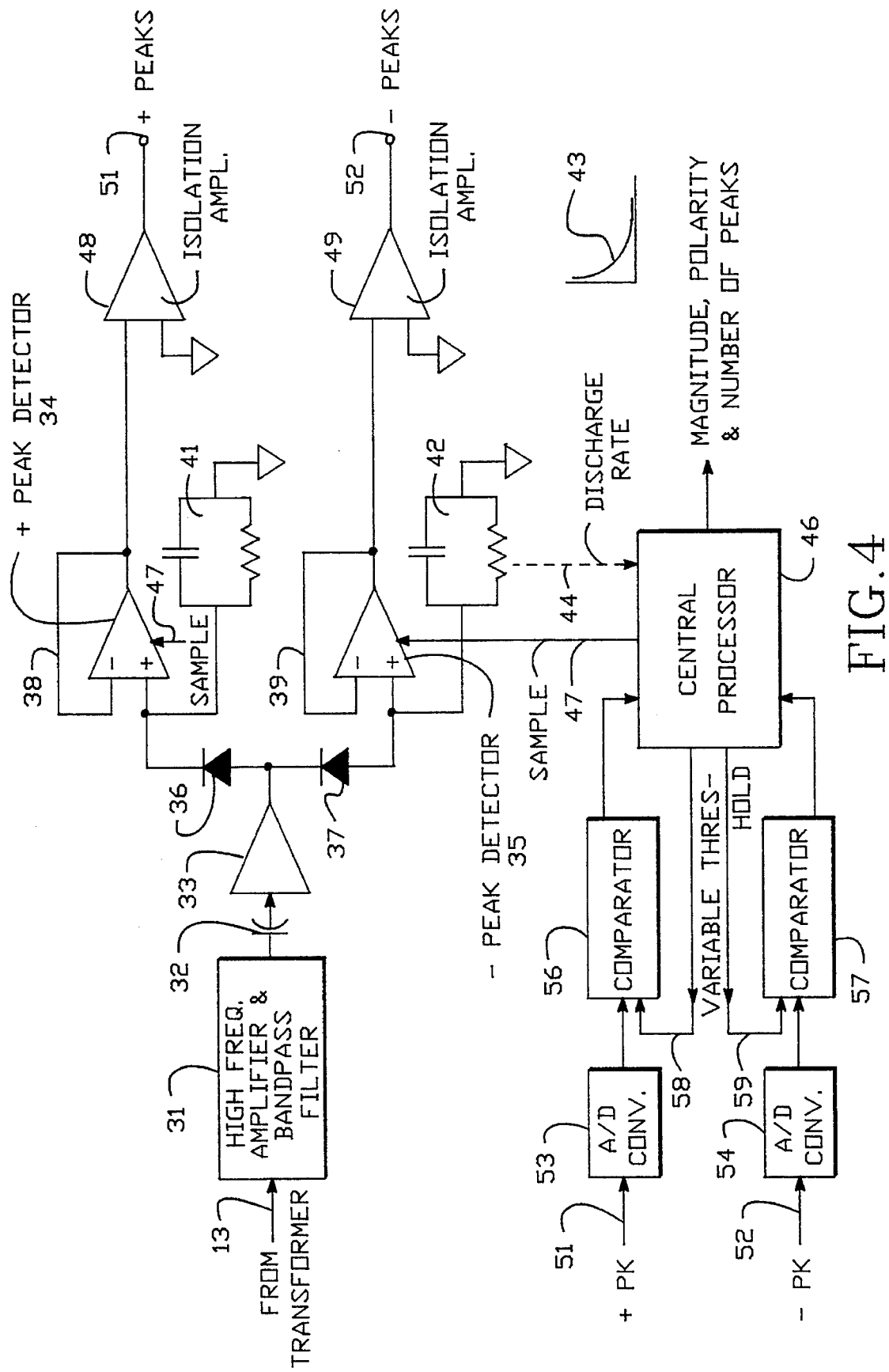
FIG. 4 is a circuit diagram of how a central processing circuit which is linked to the transformer shown in FIGS. 1 and 2.

To detect a partial discharge within a transformer a sensing element is needed which can detect discharges of a short duration and with the fast rise time of the transient signal. One technique of picking up the signal, as illustrated in FIG. 1, is the use of a circular plate 10 suspended within the tank of a transformer 11. Such transformer includes a core and coils typically having oil and paper insulation. As illustrated, the transformer is three-phase having high and low voltage terminals A1, A2, B1, B2, C1, C2; and a neutral terminal N. Sensing means to sense transient partial discharges in the insulating medium of the transformer (oil or paper) includes the plate 10 and associated electrical circuitry contained within the unit 12. The transient partial discharge will generate electric signals which can be sensed by plate 10. In general the electrical signals are transmitted over the output lead 13 which extends to a central processor as illustrated in FIG. 4.

Figure 2:
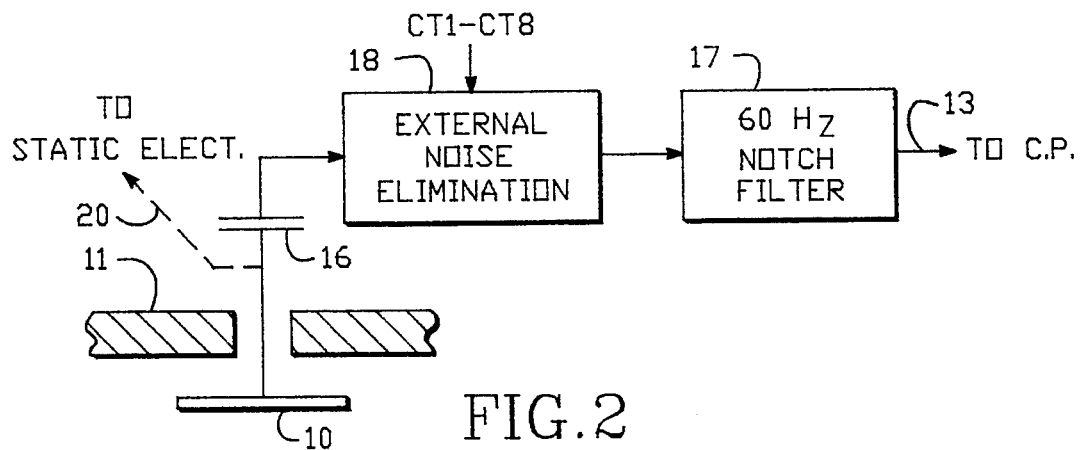
FIG. 2 is a greatly expanded view partially in cross section of a portion of FIG. 1.
Figure 3:
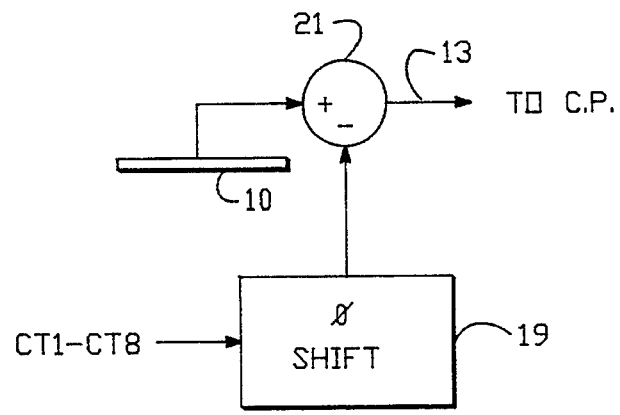
FIG. 3 is a more detailed view of a portion of FIG. 2.

In any case, the electronics in the unit 12 on top of the transformer 11 is better illustrated in FIG. 2 and includes a high frequency AC coupling capacitor 16, a 60 hertz notch filter 17 (or a notch filter at the power frequency which in Europe and Canada would be 50 hertz) and may include an external noise elimination circuit 18. This provides on line 13 electrical signals which correspond to the partial discharges. External noise elimination as illustrated by unit 18 of FIG. 2, if present, is provided by the use of current transducers or transformers CT1 through CT8 which sense the currents in the terminals of the transformers A1, A2, B1, B2, C1, C2 and N, and also the grounding lead via CT 8. Such noise may be eliminated as shown in FIG. 3 by use of the sensed current from the various terminals of the transformer applied to the phase shifter 19 and then subtracted at unit 21 from the signal generated by the pickup plate 10. Thus line 13 provides a noise free signal. Other techniques are equally applicable by using well known correlation techniques to correlate CT1 through CT5 signals with a signal picked up by the plate 10. As will be discussed below, in some cases plate 10 can be eliminated by the use of the CT, for PD detection.

Referring to plate 10, this is a plate of stainless steel or other metal compatible with the transformer tank which may by 0.5 inches thick and 17 inches in diameter; in general of a thickness and diameter to match requirements for the transformer tank. The shaft of the plate passes through the transformer 11 itself as illustrated in FIG. 2 through a Teflon (or similar dielectric material type) bushing which also provides support for the plate. Plate 10 is spaced from the transformer top by 0.5 inches.

Parenthetically it should be mentioned a plate 10 as described has been used in the past for static electrification measurements which is primarily a DC signal; in other words, the total buildup of static charge in the transformer. It has been termed a Nilsson plate. In the present invention, as shown by dashed line 20, it may still be used for this static detection. For the PD detector, however, this DC signal is deliberately eliminated by the proper DC filtering as by the use of the coupling capacitor 16 as shown in FIG. 2.

Moreover such a plate when used in air for dielectric system measurements was termed a Wilson plate. However, the plate 10 when placed inside the transformer tank with the proper geometry acts as a capacitive voltage divider or a plate antenna which in the context of the present invention can be used as the sensor of the high frequency transients caused by partial field discharges.

As discussed above, the signals sensed by the plate 10 may include significant noise generated from outside the transformer tank. And as illustrated in FIG. 1, the current transducers CT1 through CT8 both measure the currents flowing into or out of the terminals of the transformer 11 or from the transformer tank to the ground. Such "CT" measurements may be accomplished by linear couplers, high frequency current transformers, Rogowsky coils, or fiberoptic current transducers. Fiberoptic current transducers are preferable because of their wider bandwidth.

Figure 9:
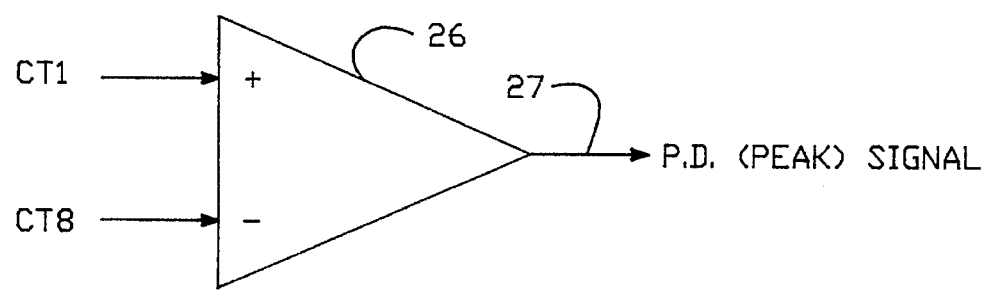
FIG. 9 is an electrical circuit showing an alternative embodiment of FIG. 2.

Although the current transducers are normally used for eliminating external noise, some or all of the transducers, for example, CT1 and CT8 as illustrated in FIG. 9 may be used by themselves to produce a partial discharge signal. This may be an alternative to the use of plate 10. As illustrated in FIG. 9, transducers CT1 and CT8 are differenced in the amplifier 26 to produce on the output 27 a partial discharge signal similar to that on line 13 in FIG. 1.

Referring now to the electrical processing unit of FIG. 4, the PD signal on line 13 from the transformer is amplified and filtered by a high frequency amplifier and bandpass filter 31, passed through a DC blocking capacitor 32 (if needed) and again amplified at 33. Filter 31 typically would have a bandpass from 50 kHz to 2 mHz. A pair of positive and negative peak detectors 34 and 35, respectively, are coupled to the amplifier 33 by the oppositely connected diodes 36 and 37. Peak detectors include feedback loops 38 and 39 to provide a normal peak detection function in which the input signal is tracked in a signal mode and then the highest input is then preserved in a hold mode. The peak detectors are modified with a discharge time constant provided by the capacitive-resistive discharge units 41 and 42 respectively which provide a discharge rate for any signal as illustrated at 43. This time constant has been set to about 8 milliseconds to enable the sampling of the outputs from the peak detectors by means of a relatively slow sampling system. The discharge is coordinated as shown by the dashed line 44, to a central processor unit 46. If a signal amplitude at a given time point, for example, a previously detected peak, is less than the curve shown at 43, then it is not counted but rather assumed to be part of the naturally decaying partial discharge signal. In other words, false multiples of a single discharge signal are eliminated.

The central processor unit 46 via the line 47 also causes the peak detectors to sample at a predetermined rate, for example 1200 hertz. The output of the peak detectors 34 and 35 pass through the isolation amplifiers 48 and 49 to provide on lines 51 and 52 signals representing positive and negative peaks of the partial discharge. These are processed by analog to digital converters 53, 54 and effectively compared by comparators 56 and 57 by use of four different variable thresholds on the lines 58 and 59 provided by central process unit 46. Normally the comparator functions of FIG. 4 are more typically accomplished by software implementation.

Figure 6:
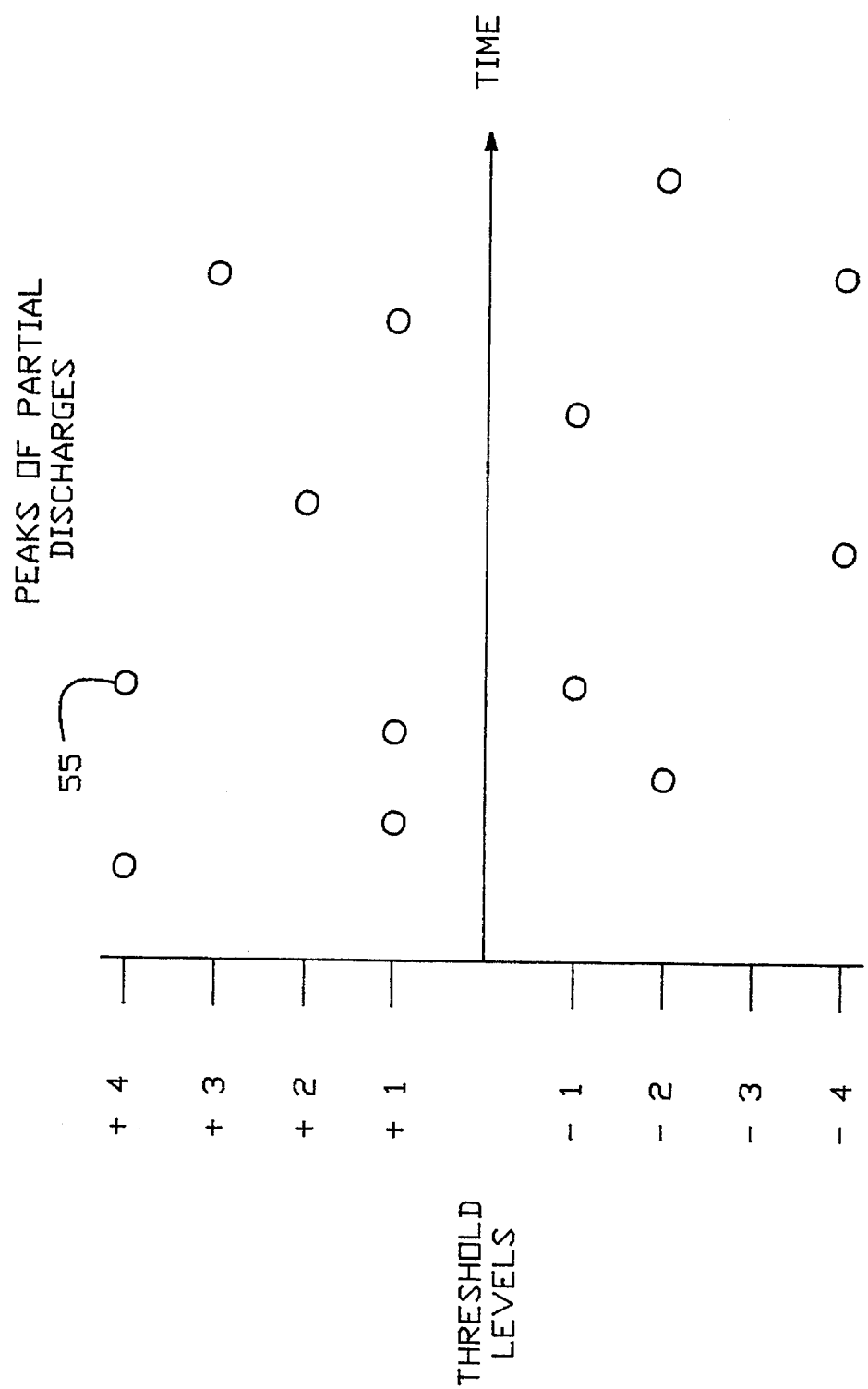
FIG. 6 is a graph indicating the result of the operation of the circuit of FIG. 4 and the flow chart of FIG. 5.

The final output of the central processor is thus an indication of the magnitude, polarity, and the number of peaks 55 as shown in FIG. 6. Here there are four different threshold levels(as provided on lines 58 and 59 of FIG. 4) both for the positive and negative discharge peaks. These are thus relative magnitudes of peak discharges and are taken over a period of time as determined by the sampling of the central processor 46 (for example, every three minutes). There may be a period in which samples are taken of 20 seconds. However, a preferred implementation would continuously sample the peak detectors. The number of peaks indicated by the circles 55. The effective graph of FIG. 6 may be interpreted visually or by computer techniques. As stated above, as the number and severity of partial discharges rises, this is an indication of incipient transformer failure.

Figure 5:
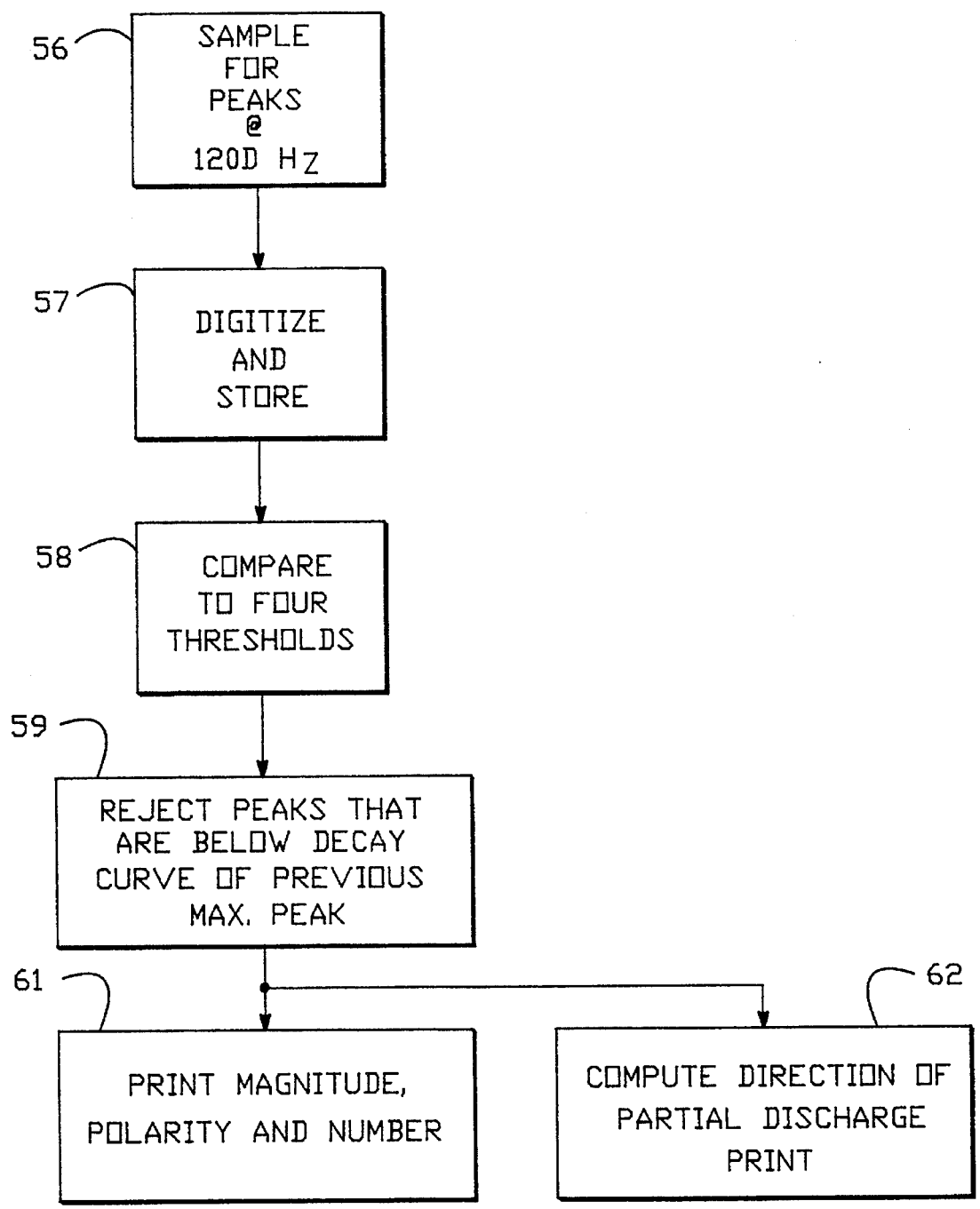
FIG. 5 is a flow chart illustrating the effective operation of FIG. 4.

The flow chart of FIG. 5 illustrates the functioning of FIG. 4 and may be implemented fully or partially in software. Thus in step 56 the peaks are sampled at a 1200 hertz rate as determined by central processor 46 and sampling line 47. The 1200 hertz rate, however, is not critical. Other sampling rates can be chosen especially adapted to the severity of PD activity. The peaks are then digitized and stored in step 57 and compared to the four threshold levels indicated in FIG. 6 as shown in step 58. In step 59 peaks below decay curve 43 are rejected. And in step 61 the magnitude, polarity and the number of peaks may be printed as shown in FIG. 6.

Figure 7:
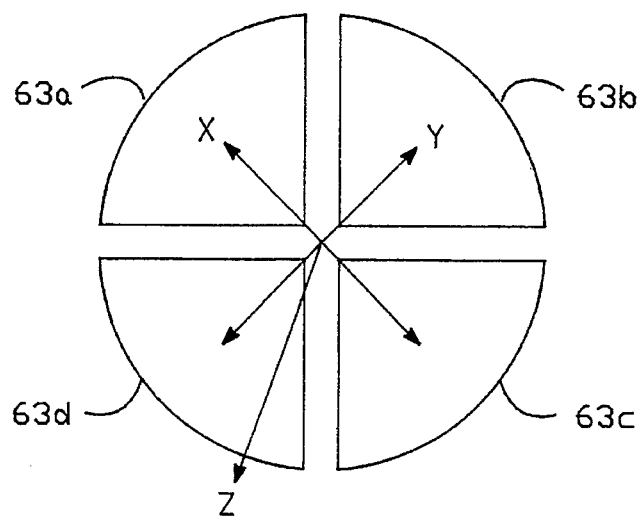
FIG. 7 is a plan view of an alternative embodiment of a portion of FIGS. 1 and 2.
Figure 8:
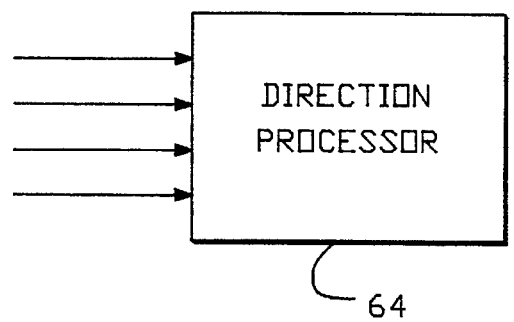
FIG. 8 is a block diagram of an electrical circuit associated with FIG. 7.

Step 62 is as an alternative embodiment where the direction of a partial discharge from the pickup plate 10 (see FIG. 1) may be determined. Referring to FIG. 7 such technique involves splitting plate 10 into two, four, or more sectors and processing signals from each plate individually as discussed above. With the four quadrant design, 63a–63d, of FIG. 7, it may sense partial discharge signals as being located anywhere in a hemisphere on the sensing side of the plate. Based on the signal strength of the respective signals associated with each of the four quadrant plates, X, Y and Z signals may be derived and by using simple spherical geometric calculations, their relative circular direction to the plate may be computed. This is illustrated in FIG. 8 where the four signals to the plate are processed by the direction processor 64.

Thus a method of electrically detecting on-site transient partial discharges in the insulating medium of an electrical power transformer and apparatus therefor has been provided.

What is claimed is:

1. A method of electrically detecting on-site transient partial discharges in the insulating medium of an electrical power transformer or similar electrical equipment including plate means suspended within the tank of said transformer comprising the following steps:

sensing electrical signals generated by said transient partial discharges in the insulating medium by use of said plate means;

filtering said signals to reject both direct current and 60 hertz frequencies;

detecting the amplitude peaks of each of said signals and providing an indication of their relative magnitudes and frequency of occurrence.

2. A method as in claim 1 including the step of eliminating noise from said signals.

3. A method as in claim 2 wherein said step of eliminating noise includes the step of sensing noise in various terminals of said transformer.

4. A method as in claim 1 wherein said plate means is formed into sections, and said sensing step includes the step of sensing the angular direction of said partial discharge relative to said sections of said plate means.

5. A method as in claim 1 where said signals are sensed by sampling.

6. A method as in claim 1 including the step of bandpass filtering said signals and then detecting.

7. Apparatus for detecting transient partial discharges in the insulating medium of an electrical power transformer or similar electrical equipment having a tank for containing its components comprising:

plate means suspended within said tank of said transformer acting as an antenna for sensing electrical signals generated by transient partial discharges in the insulating medium;

means for filtering out of said signals both direct current and 60 hertz frequencies;

means for detecting the amplitude peaks of each of said signals and providing an indication of their relative magnitudes and frequency of occurrence.

* * * * *